United States Patent [19]
Roza et al.

[11] Patent Number: 4,692,718
[45] Date of Patent: Sep. 8, 1987

[54] TUNABLE ASTABLE MULTIVIBRATOR WITH BUFFER TRANSISTORS

[75] Inventors: Engel Roza; Hendrik G. Van Veenendaal, both of Eindhoven, Netherlands

[73] Assignee: U.S. Philips Corporation, New York, N.Y.

[21] Appl. No.: 846,532

[22] Filed: Mar. 31, 1986

[30] Foreign Application Priority Data

Apr. 12, 1985 [NL] Netherlands ............... 8501088

[51] Int. Cl.$^4$ .............................. H03K 3/282
[52] U.S. Cl. ..................... 331/113 R; 331/177 R; 331/179
[58] Field of Search ............ 331/113 R, 111, 144, 331/177 R, 179

[56] References Cited

U.S. PATENT DOCUMENTS 3,857,110 12/1974 Grebene ............... 331/113 R X
4,468,636 8/1984 Monticelli ............... 331/113 R
4,600,897 7/1986 Koga et al. ............... 331/144 X Primary Examiner—Siegfried H. Grimm
Attorney, Agent, or Firm—Thomas A. Briody; William J. Streeter; Gregory P. Gadson

[57] ABSTRACT

A tunable oscillator circuit provided with a pair of oscillator transistors whose bases are crosscoupled to the opposite collectors, and provided with a capacitance which is arranged between the emitters of the oscillator transistors, each emitter being AC-connected via an emitter current source to a reference voltage is disclosed. In order to considerably increase the tuning range without being limited in the choice of the output amplitude, a pair of buffer transistors in common base configuration is added whose two collectors are connected via a pair of collector resistors to a supply voltage and constitute an output of the tunable oscillator circuit, said pair of buffer transistors arranged in a cascode configuration with the pair of oscillator transistors by being coupled to the collectors of the oscillator transistors.

6 Claims, 2 Drawing Figures

TUNABLE ASTABLE MULTIVIBRATOR WITH BUFFER TRANSISTORS

BACKGROUND OF THE INVENTION

The invention relates to a tunable oscillator circuit provided with a pair of oscillator transistors whose bases are connected crosswise to the opposite collectors, and a capacitance which is arranged between the emitters of the oscillator transistors, each emitter being connected to a reference voltage via an emitter current source.

A tunable oscillator circuit of this type—also referred to as a tunable astable multivibrator—is known per se, for example, from the article "Monolithic waveform generation" by A. B. Grebene, published in "IEEE Spectrum" of April 1972, pages 34-40. The known oscillator circuit is tuned by a variation of the emitter current sources of the oscillator transistors. An output is constituted by the collectors of the oscillator transistors. Each collector is connected to the supply voltage via a parallel arrangement of a collector resistor and a limiting diode. The limiting diodes determine and limit the capacitance voltage variation and, together with the magnitude of the currents of the emitter current sources and the magnitude of the capacitance C, they determine the frequency of oscillation. However, the tuning range at the high end is limited by parasitic capacitances of the oscillator transistors and the limiting diodes.

SUMMARY OF THE INVENTION

It is an object of the invention to extend the tuning range of the prior art tunable astable multivibrator in a simple manner without being limited in the choice of the oscillator output voltage.

According to the invention a tunable oscillator circuit of the type described in the opening paragraph is characterized by a pair of buffer transistors in common base configuration, whose two collectors are connected via a pair of collector resistors to a supply voltage and constitute an output of the tunable oscillator circuit, said pair of buffer transistors being arranged in a cascode configuration with the pair of oscillator transistors, the emitter current of the buffer transistors being equal to the sum of the base collector currents of the oscillator transistors.

The use of a pair of buffer transistors in a cascode configuration with a pair of amplifer transistors to limit the so-called Miller-effect is known per se from Japanese Patent Publication Kokai No. 147016/80 of Nov. 15, 1980.

The invention is based on the recognition of the fact that on the one hand the small signal series resistance together with the base series resistance transposed to the emitter of the buffer transistors constitute a sufficiently high impedance for the oscillator transistors to maintain a loop gain of more than one over a wide tuning range with commonly used emitter currents of, for example, several mA's and hence to maintain an oscillation, and that on the other hand this impedance is sufficiently low to result in a considerably smaller capacitance voltage variation with said commonly used emitter currents than in the known case.

When using the step according to the invention the capacitance voltage variation is considerably smaller than in the known case, so that a higher tuning frequency can be attained under equivalent circumstances. In addition the buffer transistors separate the output of the oscillator circuit from the collectors of the oscillator transistors, so that the oscillator output voltage is adjustable to a desired value by suitable choice of the collector resistance without influencing the oscillator frequency.

For a further increase of the highest oscillator frequency in the tuning range the tunable oscillator circuit according to the invention is preferably characterized in that the emitter surface of the oscillator transistors is at least 1.25 times larger than that of the buffer transistors.

This step is based on the recognition of the fact that the base series resistance of the buffer transistors transposed to the emitter can constitute a sufficiently larger inductive load for the oscillator transistors in order to considerably compensate the parasitic collector base capacitance of the oscillator transistors, notably at high frequencies.

When using the latter step such a compensation is effected, that parasitic feedbacks are greatly reduced, so that also for very high frequencies the condition for oscillatio are complied with and the operating range of the oscillator circuit is considerably increased in frequency.

For a further decrease of the lowest oscillator frequency in the tuning range the tunable oscillator circuit according to the invention is preferably characterized in that the two emitters of the pair of buffer transistors are coupled via a pair of resistors to the two collectors of the pair of oscillator transistors.

This step is based on the recognition of the fact that the lower tuning range is limited because the collector impedance of the oscillator transistors, and notably the inductive part thereof, at the emitters of the buffer transistors is too low for low frequencies to realize a loop gain which is sufficiently large to maintain oscillation.

When the latter step is used, said resistors increase the collector impedance of the oscillator transistors, so that also for low frequencies the oscillator transistor gain is sufficiently large to comply with the oscillation conditions.

A further preferred embodiment of a tunable oscillator circuit of this type is characterized by a further pair of buffer transistors in common base configuration, which are arranged in a cascode configuration with the pair of oscillator transistors whose two collectors, combined with those of the first-mentioned pair of buffer transistors, are connected via the pair of collector resistors to the supply voltage and whose two emitters are connected via a pair of resistors to the two collectors of the pair of oscillator transistors, a switching voltage being provided at the bases of each of the two pairs of buffer transistors for switching the operation from one to the other pair of buffer transistors.

When this step is used the oscillator circuit is accurately tunable to a desired frequency within a very wide frequency range, for example, the television frequency range of 45–855 Mhz.

The tunable oscillator circuit according to the invention is preferably characterized by a pair of control transistors whose bases and collectors are coupled to the bases and collectors, respectively, of the first-mentioned pair of oscillator transistors and whose interconnected emitters are connected to a controllable current source, the emitter current sources of the oscillator transistors being controllable in a direction opposite to that of the controllable current source, such that the sum of the emitter current sources and the controllable current source is at least substantially constant within the tuning range. The use of a fixed capacitor and a tuning which can easily be realized is thus possible.

BRIEF DESCRIPTION OF THE DRAWINGS

The invention will be described in greater detail with reference to the Figures shown by way of example in the drawing.

In this drawing.

DETAILED DESCRIPTION OF THE INVENTION

Figure 1:
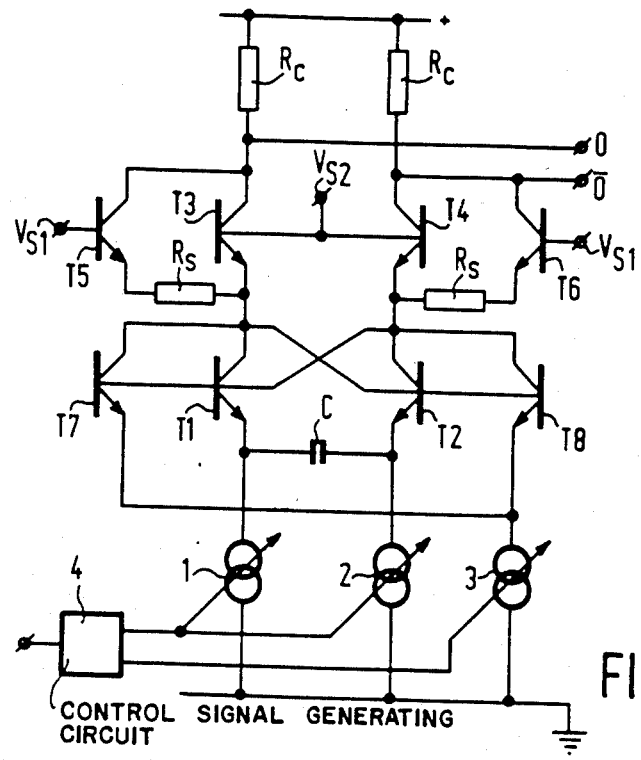
FIG. 1 shows an embodiment of a tunable oscillator circuit according to the invention using band-switching, a current-controlled tuning and an oscillator part which is common to the different bands.

FIG. 1 shows a tunable oscillator circuit of the astable multivibrator type having a first pair of oscillator transistors T1, T2 whose bases are connected crosswise to the opposite collectors and a capacitance C between the emitters of T1 and T2 which are connected to ground with respect to alternating current via mutually equal controllable emitter current sources 1 and 2. A first pair of buffer transistors T3, T4 is arranged in a cascode configuration with the first pair of oscillator transistors T1 and T2 between the collectors of T1 and T2 and a supply voltage the emitter current of the buffer transistors T3 and T4 being equal to the sum of the base and collector currents, respectively, of the oscillator transistors T1 and T2. The collectors of the buffer transistors T3 and T4 constitute an output 0, $\bar{0}$ of the oscillator circuit and are connected to the supply voltage via mutually equal collector resistors $R_C$, while their bases are connected to a common switching voltage $V_{S2}$ and are therefore connected to ground with respect to alternating current. A further pair of buffer transistors T5 and T6 hereinafter referred to as second pair is arranged in a cascode configuration with the first pair of oscillator transistors T1 and T2, the emitters being coupled via mutually equal resistors $R_S$ to the collectors of T1 and T2, respectively. The collectors of the buffer transistors T5 and T6 are connected to those of buffer transistors T3 and T4, respectively, and the bases are coupled to a common switching voltage $V_{S1}$ and are connected to ground with respect to alternating curren via this switching voltage.

Control transistors T7 and T8 are respectively arranged across each oscillator transistor T1 and T2, the collectors and bases of said control transistors T7 and T8 being coupled to those of the respective oscillator transistors T1 and T2, and their emitters being interconnected and connected to ground via a control current source 3. Control signals are applied to the emitter current sources 1 and 2 at one end and the control current source 3 at the other end from a control signal generating circuit 4 under the influence of a single input control signal, in such manner that the currents of emitter current sources 1 and 2 are varied in opposite directions with respect to that of the control current source 3, the total sum of currents of said current sources 1–3 remaining constant. The construction of such a control signal generating circuit 4 is known to those skilled in the art and for clarity's sake it will not be described in greater detail.

The switching voltages $V_{S1}$ and $V_{S2}$ vary in a stepwise manner from a high to a low value, where $V_{S1}$ is high when $V_{S2}$ is low and vice versa. If the switching voltage $V_{S1}$ is high and the switching voltage $V_{S2}$ is low, the buffer transistors T5 and T6 are in a conducting state and the buffer transistors T3 and T4 are blocked so that tuning in a lower part (for example, VHF and hyperband) of the total tuning range is possible. In the reverse state tuning in a higher part (for example, UHF band) of the total tuning range is possible.

The emitter surface of each oscillator transistor T1 and T2 is preferably at least 1.25 times larger—in a practical embodiment 1.5 times larger—than the emitter surface of each buffer transistor T3 and T4. The intrinsic base series resistance (not shown) of the buffer transistors T3 and T4 transposed to the emitter then constitutes an inductive impedance for the oscillator transistor T1 and T2, being sufficiently large to at least considerably compensate the parasitic collector-base capacitance of these oscillator transistors.

The inductive effect of the base-series resistance of a bransistor transposed to the emitter is described in the article 'Use of transistor-simulated inductance as an interstage element in broadband amplifier' by J. A. Archer et al, published in IEEE Journal of Solid State Circuits, Vol. SC-3, No. 1, March 1968, pages 12–21.

When tuning to the highest oscillator frequency of the total tuning range is desired, $V_{S2}$ should be high and $V_{S1}$ should be low, while the currents of the emitter current sources 1 and 2 are adjusted to a maximum value and the current of the control current source 3 is adjusted to a minimum value or zero. Due to the fact that the collector impedance is only several tens of ohms which is the case when normal values for the currents of the emitter current sources 1 and 2 of several mA's are used, thus causing the capacitance voltage variation to be very low, this highest oscillation frequency may be considerably higher than in the known case. In addition the said emitter surface dimensioning results in a compensation of the parasitic collector base capacitance of the oscillator transistors T1 and T2, notably by the inductive part (mainly caused by the base-series resistance of the buffer transistors T3 and T4 transposed to the emitter of the collector impedance so that a still further increase of the highest oscillator frequency is attained.

The frequency is decreased by causing the current of the control current source 3 to increase and simultaneously causing the currents of the emitter current sources 1 and 2 to decrease. Due to the total current of these current sources 1–3 remaining equal, such a variation only influences the current division between the oscillator transistors T1 and T2 on the one hand and the control transistors T7 and T8 on the other hand without changing the collector voltage amplitude of these transistors. Uniform tuning is therefore possible.

The influence of the said inductive part on the total collector impedance lessens during this frequency decrease. The collector impedance remains, however, sufficiently high to maintain an oscillation over a comparatively large frequency range (for example, UHF-band), In the case of a further frequency decrease the switching voltages $V_{S1}$ and $V_{S2}$ should be inverted in their level and simultaneously the currents of the emitter current sources 1 and 2 should be adjusted to a maximum value and the current of the controllable current source 3 should be adjusted to a minimum value or zero amply before the circuit stops oscillating due to a too small loop gain. Because of the resistors $R_S$ it is possible to maintain the state of oscillation down to the lowest frequency in the VHF-band.

It stands to reason that a more accurate tuning is possible by adding a third pair of buffer transistors (not shown) in one and the same configuration as the second pair of buffer transistors T5 and T6, including resistors corresponding with and being chosen in appropriate ratio relative to the emitter resistors $R_S$ shown, so as to realize an optimum band division of the tuning range to be covered.

Figure 2:
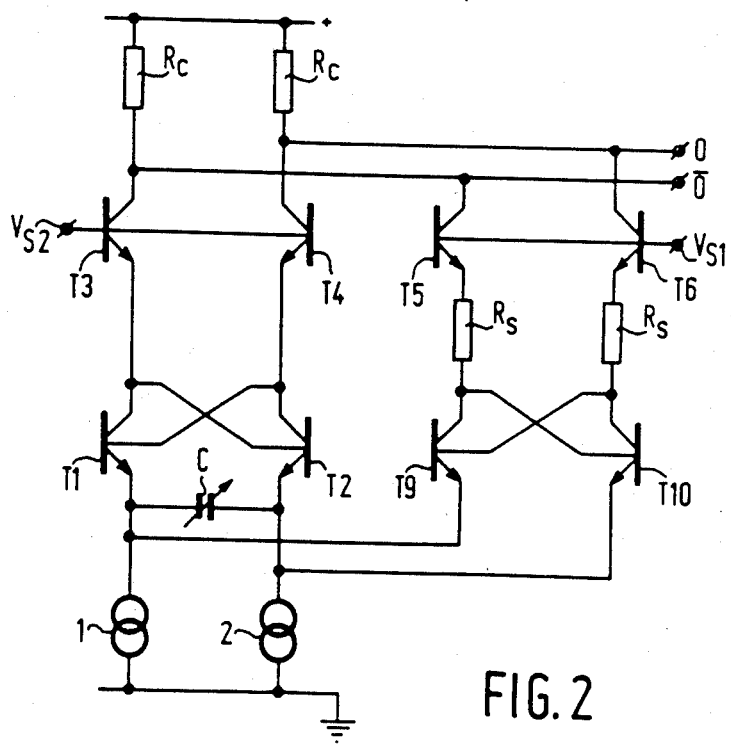
FIG. 2 shows an alternative embodiment of a tunable oscillator circuit according to the invention.

FIG. 2 shows an alternative embodiment of a tunable oscillator circuit according to the invention in which elements already described and shown in FIG. 1 have the same reference indications. Unlike the previous Figure the tuning in this Figure is varied by varying the capacitance C for which, for example, a variable capacitor diode is used in known manner. Furthermore this oscillator circuit is provided with a further pair of oscillator transistors T9 and T10 hereinafter referred to as second pair which are arranged in the same cascode configuration as T1–T4 relative to the buffer transistors T5 and T6. This second cascode configuration T5, T6, T9, T10 is coupled via the collectors of the buffer transistors T5 and T6 to the collector resistors $R_C$ and arranged via the emitters of the oscillator transistors T9 and T10 across the capacitance C, while the beforementioned resistors $R_S$ are arranged between the emitters of T5 and T6 and the collectors of T9 and T10.

In the case of a switch-over not only the buffer transistors T3, T4 and T5, T6 are switched on or off, respectively, in this oscillator embodiment, but also the oscillator transistors T1, T2 and T9, T10, respectively, arranged in a cascode configuration, therewith. By adding a third cascode configuration of pairs of buffer and oscillator transistors, a more accurate tuning is possible in the case of appropriately chosen emitter resistors.

Further it will be obvious that the current-controlled tuning of the circuit of FIG. 1 is applicable to that of FIG. 2 and vice versa.

What is claimed is:

1. A tunable oscillator circuit provided with a pair of oscillator transistors whose bases are connected crosswise to the opposite collectors, and a capacitance which is arranged between the emitters of the oscillator transistors, each emitter being connected via an emitter current source to a reference voltage, characterized by a pair of buffer transistors in common base configuration, whose two collectors are connected via a pair of collector resistors to a supply voltage and constitute an output of the tunable oscillator circuit, said pair of buffer transistors being arranged in a cascode configuration with the pair of oscillator transistors, the emitter current of the buffer transistors being equal to the sum of the base and collector currents of the oscillator transistors.

2. A tunable oscillator circuit as claimed in claim 1, characterized in that the emitter surface of the oscillator transistors is at least 1.25 times larger than that of the buffer transistors.

3. A tunable oscillator circuit as claimed in claim 1, characterized in that the two emitters of the pair of buffer transistors are coupled via a pair of resistors to the two collectors of the pair of oscillator transistors.

4. A tunable oscillator circuit as claimed in claim 1 or 2, characterized by a further pair of buffer transistors in common base configuration, which are arranged in a cascode configuration with the pair of oscillator transistors whose two collectors, together with those of the first-mentioned pair of buffer transistors, are connected via the pair of collector resistors to the supply voltage and whose two emitters are connected via a pair of resistors to the two collectors of the pair of oscillator transistors, a switching voltage being provided at the bases of each of the two pairs of buffer transistors for switching the operation from one to the other pair of buffer transistors.

5. A tunable oscillator circuit as claimed in claim 1 or 2, characterized by a further pair of buffer transistors in common base configuration which is arranged in a cascode configuration with a further pair of base-collector cross-coupled oscillator transistors via a pair of resistors, the collectors of said further pair of buffer transistors, together with those of the first-mentioned pair of buffer transistors being connected via the said pair of collector resistors to the supply voltage, the emitters of the further pair of oscillator transistors being coupled to those of the first-mentioned pair of oscillator transistors, between which the said capacitance is arranged, a switching voltage being provided at the base of each of the two pairs of buffer transistors for switching the operation from one to the other pair of buffer transistors.

6. A tunable oscillator circuit as claimed in any one of claims 1–3, characterized by a pair of control transistors whose bases and collectors are coupled to the bases and collectors, respectively, of the first-mentioned pair of oscillator transistors, and whose interconnected emitters are connected to a controllable current source, the emitter current sources of the oscillator transistors being adjustable in a direction opposite to that of the controllable current source, such that the sum of the emitter current sources and the controllable current source is at least substantially constant within the tuning range.

* * * * *